United States Patent [19]
Griswold et al.

[11] Patent Number: 5,422,514
[45] Date of Patent: Jun. 6, 1995

[54] PACKAGING AND INTERCONNECT SYSTEM FOR INTEGRATED CIRCUITS

[75] Inventors: Bradley L. Griswold, San Jose; Chung W. Ho, Monte Sereno; William C. Robinette, Jr., Los Altos, all of Calif.

[73] Assignee: Micromodule Systems, Inc., Cupertino, Calif.

[21] Appl. No.: 60,406

[22] Filed: May 11, 1993

[51] Int. Cl.6 ............................................. H05K 3/34
[52] U.S. Cl. ................................. 257/679; 257/723; 257/787
[58] Field of Search ............... 257/679, 723, 773, 787, 257/697, 685

[56] References Cited

U.S. PATENT DOCUMENTS

| | | | |
|---|---|---|---|
| 4,251,852 | 2/1981 | Ecker et al. | 257/697 |
| 4,931,853 | 6/1990 | Ohuchi et al. | 257/679 |
| 5,048,179 | 9/1991 | Shindo et al. | 257/679 |
| 5,138,433 | 8/1992 | Hiruta | 257/773 |
| 5,138,436 | 8/1992 | Koepf | 257/723 |
| 5,196,992 | 3/1993 | Sawaya | 257/787 |
| 5,239,198 | 8/1993 | Lin et al. | 257/787 |

*Primary Examiner*—Rolf Hille
*Assistant Examiner*—Roy Potter
*Attorney, Agent, or Firm*—D'Alessandro & Ritchie

[57] ABSTRACT

A thin MCM packaging structure and technique is provided in which a thin film decal interconnect circuit is fabricated on a thin aluminum wafer. The thin-film decal interconnect employs Au metallurgy for bonding and comprises a bond pad/ground plane layer, topside pads, and one or more routing layers. The top routing layer also acts as the pad layer along the edge of the interconnect structure. The underside of the decal interconnect structure is provided with metal pads for attachment to conventional aluminum or gold I/O pads on one surface of the integrated circuit die. A thermosonic bonding system is used to bond the die pads to the pads. The aluminum wafer is selectively removed forming one or more cavities to hold one or more die to be mounted on the MCM structure. The die are oriented with their pads in contact with contact pads on the thin-film decal interconnect to which they are bonded and the cavities are filled with a liquid encapsulant and cured. The composite structure may be lapped down to minimize overall package thickness and to expose the backsides of the integrated circuit die for thermal management.

13 Claims, 6 Drawing Sheets

PACKAGING AND INTERCONNECT SYSTEM FOR INTEGRATED CIRCUITS

BACKGROUND OF THE INVENTION

1. Field of the Invention

The present invention relates to integrated circuit technology. More specifically, the present invention relates to a packaging and interconnect system for integrated circuits.

2. The Prior Art

Multi-chip modules (MCM) comprising a plurality of integrated circuit dice mounted on a single carrier substrate and a package which provides an interconnect and support function are known in the art. Their use has increased substantially in recent years, and there is an increasing number of applications for MCM technology. The development of MCM devices has required the co-development of suitable mounting and connection technologies. There have been several prior art solutions used to mount and connect die to MCM devices.

According to one prior art approach to mounting a plurality of integrated circuit die on a single MCM substrate, a first multilayer interconnect circuit for interconnecting a plurality of integrated circuit die comprises alternating layers of an insulating material and metal lines and is formed on a first aluminum wafer. The first aluminum wafer carrying the first multilayer interconnect circuit is bonded to a stainless steel circumferential support ring. The first aluminum wafer is etched away, leaving the multilayer interconnect circuit supported by the stainless steel circumferential support ring.

If necessary due to interconnect density, a second multilayer interconnect circuit for interconnecting a plurality of integrated circuit die may be formed on a second aluminum wafer. The second aluminum wafer is bonded to the bottom of the first multilayer interconnect circuit. The second aluminum wafer is then etched away leaving the first and second multilayer interconnect circuits supported by the stainless steel circumferential support ring. Windows for the die to be mounted are cut in the multilayer interconnect circuits and a copper baseplate is bonded to the interconnect circuits. The support ring is then excised from the circuit layers and the die are then mounted on the copper baseplate containing the first and second multilayer interconnect circuits. The die are connected to the interconnect circuitry and to the MCM I/O pads using conventional TAB or wire bonding techniques.

As will be appreciated by those of ordinary skill in the art, this approach requires the use of a separate support ring which must be mated with the assembly in a discrete processing step, and yet another step is required to bond the interconnect circuit to the baseplate. In addition, the mounting of the integrated circuit die directly on the baseplate through apertures formed in the interconnect circuitry layer requires the additional step of forming the apertures prior to bonding the die on the baseplate. The die apertures also consume valuable space which could be used to route circuit traces.

According to another prior-art approach for mounting a plurality of integrated circuit die on a single MCM substrate, a multilayer thin-film interconnect circuit is deposited onto a quartz substrate. The die are then bonded to the thin film interconnect circuit and a circumferential ceramic support ring is bonded to the assembly. The quartz substrate is then removed by etching. Reach-through vias are etched in the thin film circuit to expose the I/O pads on the die and a die interconnect metal layer is formed and defined to interconnect the integrated circuit die. While this solution is useful for MCM technology, it is limited to small circuits and is not reworkable to recover yield losses.

Still another related approach, relating to die testing rather than to permanent MCM mounting techniques, is disclosed in U.S. Pat. No. 5,123,850 to Eider et al. This patent teaches the use of an interconnect circuit formed in a resilient membrane to make temporary electrical contact with pads disposed on a die. The interconnect circuit is formed from alternating layers of polyimide dielectric and metal signal lines. Electrical contact pads protrude from a top surface of the membrane and make electrical contact with individual signal lines. A semiconductor die is placed on the membrane and is aligned by visible means to ensure that the contact pads are disposed opposite pads on the die. An insert plate is placed against a bottom surface of the membrane opposite the die. The interconnect circuit is wire bonded to a pin grid array (PGA) which can be plugged into a test socket base to communicate test signals to and from the carrier. A heat sink is clipped to the PGA, and the die is pressed between the heat sink and the membrane. The force exerted against the die is expected to cause the contact pads to make electrical contact with the die pads.

While earlier chip testing carriers such as the one described above contain good design concepts there have been shortcomings with their use. For example, the gold coated pads on the contact pads often do not make adequate contact with the die pads because of the build-up of an oxide layer on the aluminum die pads.

BRIEF DESCRIPTION OF THE INVENTION

According to a first embodiment of the invention, a thin MCM packaging structure and technique is provided. A thin film multilayer interconnect circuit is fabricated on a thin aluminum wafer. According to a presently preferred embodiment, the thin-film interconnect employs Au metallurgy for bonding and comprises a bond pad/ground plane layer, topside pads, and, preferably, two or more routing layers. The top routing layer also acts as the pad layer along the edge of the interconnect structure. The underside of the interconnect structure is provided with metal pads for attachment to conventional aluminum or gold I/O pads on one surface of the integrated circuit die. A thermosonic bonding system is used to bond the die pads to the interconnect structure pads.

The aluminum wafer is selectively removed forming one or more cavities to hold one or more die to be mounted on the MCM structure. The resulting structure is referred to as a decal. The die are oriented with their pads in contact with contact pads on the thin-film decal interconnect to which they are then thermosonically bonded using a novel backside-through-via decal-to-die bonding process. The cavities are then filled with a liquid encapsulant and cured. The composite structure may be lapped down to minimize overall package thickness and to expose the backsides of the integrated circuit die for thermal management.

According to a second embodiment of the present invention, one or more die may be mechanically bonded to the thin-film decal interconnect inside the previously formed cavity or cavities with their metal pads disposed on the die surface opposite the surface bonded to the decal. The pads of the one or more die are connected to the bonding pads of the thin-film decal interconnect by wire bonding technology. The cavity or cavities are filled with a liquid encapsulant and cured. As those of ordinary skill in the art will appreciate, the composite structure of this embodiment may not be lapped due to potential damage to the wire bonds caused by the lapping process.

According to a third embodiment of the present invention, one or more first die are oriented with their pads in contact with contact pads on a first surface of the thin-film decal interconnect inside the previously formed cavity or cavities, to which they are thermosonically bonded using a novel backside-through-via decal-to-die bonding process. After the cavity or cavities are filled with a liquid encapsulant and cured, one or more second die may be mechanically bonded to a second surface of the thin-film decal interconnect with their metal pads on the surface opposite the bonding surface. The pads of the one or more second die are then connected to the bonding pads of the thin-film decal interconnect by wire bonding technology.

According to a fourth embodiment of the present invention, one or more first die may be mechanically bonded to a first surface of the thin-film decal interconnect inside the previously formed cavity or cavities, with their metal pads disposed on the surface opposite the surface mechanically bonded to the first surface of the interconnect structure. The pads of the one or more first die are connected to the bonding pads of the thin-film decal interconnect by wire bonding technology. After the cavity or cavities are filled with a liquid encapsulant and cured, one or more second die may be mechanically bonded to a second surface of the thin-film decal interconnect with their metal pads disposed on the surface opposite the surface mechanically bonded to the second surface of the thin-film decal interconnect. The pads of the one or more second die are then connected to the bonding pads of the thin-film decal interconnect by wire bonding technology.

In the above-described embodiments of the present invention, the second surface of the thin film decal can also be used to attach the I/O connectors, such as lead frames, solder balls, etc., thus permitting a dense, high-performance structure.

Those of ordinary skill in the art will recognize the several advantages of the present invention over the prior art MCM structures and mounting techniques. First, the present invention provides a greater die packing density because inter-die spacings are small and both sides of the interconnect circuitry can be used for components and connectors. In addition, the packaging technique of the present invention presents a small form factor, since the package-to-board connection area can be much smaller, i.e., a land grid array. The cost of providing complex packaging and interconnect circuits is also reduced. Also, the present invention provides high-performance circuits because of the short interconnect distances between the dice and between individual die and the decal.

The present invention also provides processing advantages since, after etching, the aluminum wafer is used to perform the function of the support ring, the process steps associated with bonding and excising the support ring are eliminated. In addition, because the die are mounted directly on the thin-film decal interconnect, the steps of defining apertures through the interconnect layer and bonding the die onto the copper baseplate are eliminated.

DETAILED DESCRIPTION OF A PREFERRED EMBODIMENT

Figure 1A:
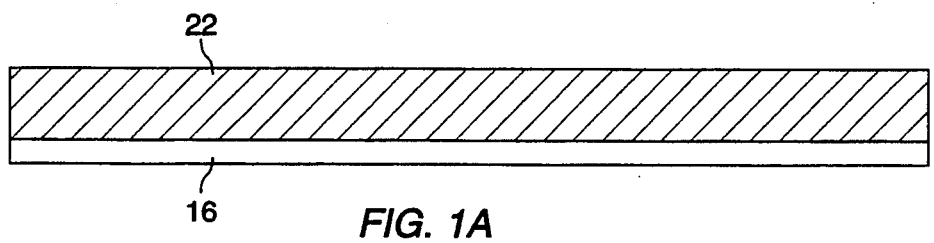
FIGS. 1a–1e are cross sectional views of a multichip module assembly according to a first embodiment of the present invention.

Those of ordinary skill in the art will realize that the following description of the present invention is illustrative only and not in any way limiting. Other embodiments of the invention will readily suggest themselves to such skilled persons.

Referring first to FIGS. 1a–1e, an illustrative MCM device 10 according to a first embodiment of the present invention is shown in cross section during various stages of its fabrication. The illustrative example depicted in FIGS. 1a–1e includes two integrated circuit die 12 and 14 mounted on a thin-film decal interconnect structure 16 in cavities 18 and 20 formed in an aluminum baseplate 22 to form a support frame 24. While the disclosure herein is directed to an aluminum baseplate 22, those of ordinary skill in the art will readily recognize that other materials, such as silicon or copper, may also be used to form baseplate 22.

Those of ordinary skill in the art will recognize that an arbitrary number of integrated circuits, limited only by the ability to provide sufficient interconnect capability in the thin-film decal interconnect structure 16, may be mounted in the MCM device 10 of the present invention.

The I/O connections of the integrated circuit die 12 and 14 in the MCM device 10 of FIGS. 1a–1e are in the form of conductive pads, typically aluminum or gold, on the surfaces of the integrated circuit dice 12 and 14 in contact with the thin-film decal interconnect structure 16 and are electrically connected to the thin-film decal interconnect structure 16 by thermosonic bonding techniques.

FIG. 1a shows the structure after the thin-film decal interconnect structure 16 has been formed on the aluminum baseplate 22 using known fabrication techniques. According to a presently preferred embodiment aluminum baseplate 22 may comprise an aluminum wafer having a thickness of about 50 mils. For ease in understanding the figure, the details of the thin-film decal interconnect structure 16 have been omitted and will be disclosed in subsequent figures herein. For the purposes of FIGS. 1a–1e, it is sufficient to understand that the thin-film decal interconnect structure 16 comprises a bonding pad/ground plane layer as the first metal layer fabricated on top of the aluminum baseplate 22, and one or more routing layers insulated therefrom and from one another.

Figure 1B:
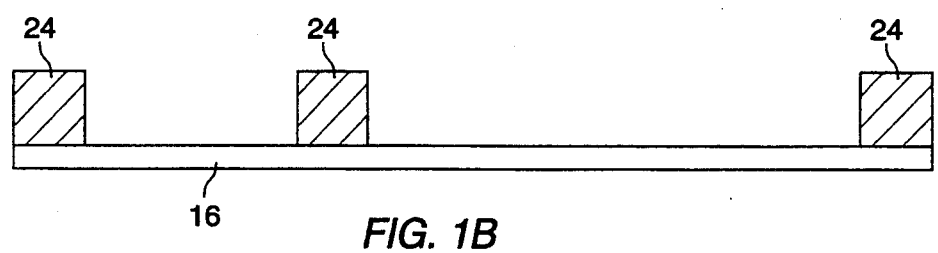

Referring now to FIG. 1b, portions of the aluminum baseplate 22 have been removed to form cavities 18 and 20 in a support frame 24. The removal of aluminum from baseplate 22 to form aluminum support frame 24 is preferably accomplished through a combination of mechanical and chemical processes. The aluminum is first partially removed by milling and the remainder is then chemically etched. This etching step may be performed using an etching process which is reactive to aluminum but not reactive to the polymer material at the surface of the thin-film decal interconnect structure 16. A presently preferred etching process comprises hydrochloric acid.

Before integrated circuit dice 12 and 14 are positioned in the cavities 18 and 20, the polymer surface of the thin-film decal interconnect structure 16 is etched to expose contact bonding pads for interconnecting to the pads on the surface of the integrated circuit die to be placed in contact with the thin-film decal interconnect structure 16. The polymer surface is blanket etched using a plasma etch process.

Figure 1C:
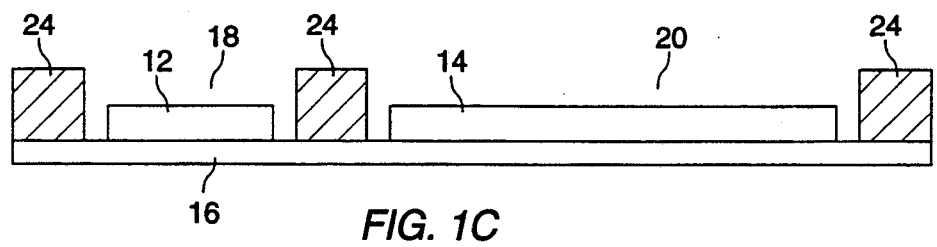

Referring now to FIG. 1c, integrated circuit dice 12 and 14 are placed in cavities 18 and 20 within support frame 24 and positioned such that their I/O pads are aligned with the exposed contact pads of the thin-film decal interconnect structure 16. The integrated circuit dice 12 and 14 are then bonded to the contact pads using conventional thermosonic bonding techniques through the bottom of the thin-film decal interconnect structure 16.

Figure 1D:
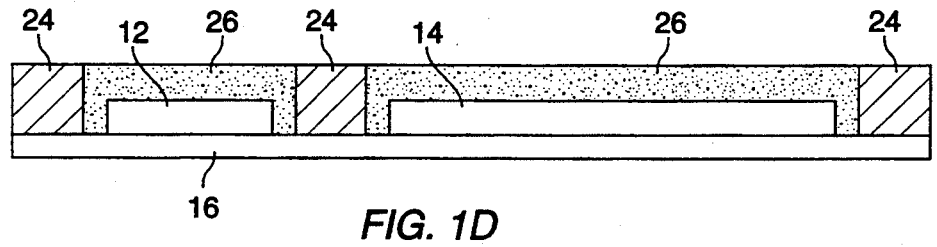

As shown in FIG. 1d, after the integrated circuit dice 12 and 14 have been bonded to the thin-film decal interconnect structure 16, the remainder of the volumes of cavities 18 and 20 within support frame 24 are filled under vacuum with a liquid encapsulant, such as epoxy (shown at reference numeral 26), which is then cured as is known in the art. The structure is essentially complete.

Figure 1E:
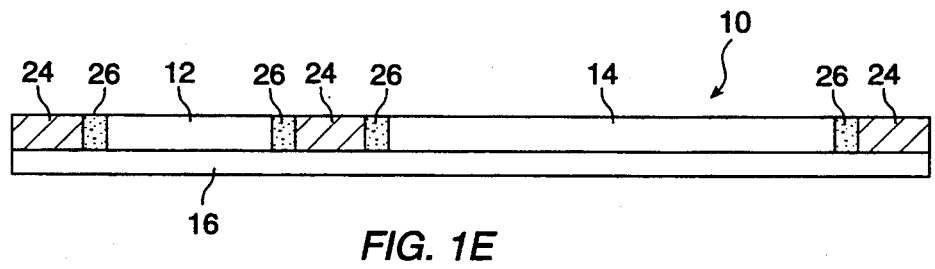

As shown in FIG. 1e, the composite structure may be lapped, if necessary, to minimize the overall package thickness and to expose the backsides of the integrated circuit dice 12 and 14 for thermal management purposes. Once the backsides of the integrated circuit dice 12 and 14 have been exposed, some form of heat sink structure (not shown) may be thermally coupled to the exposed integrated circuit dice 12 and 14 surfaces as is well known in the art.

Figure 2A:
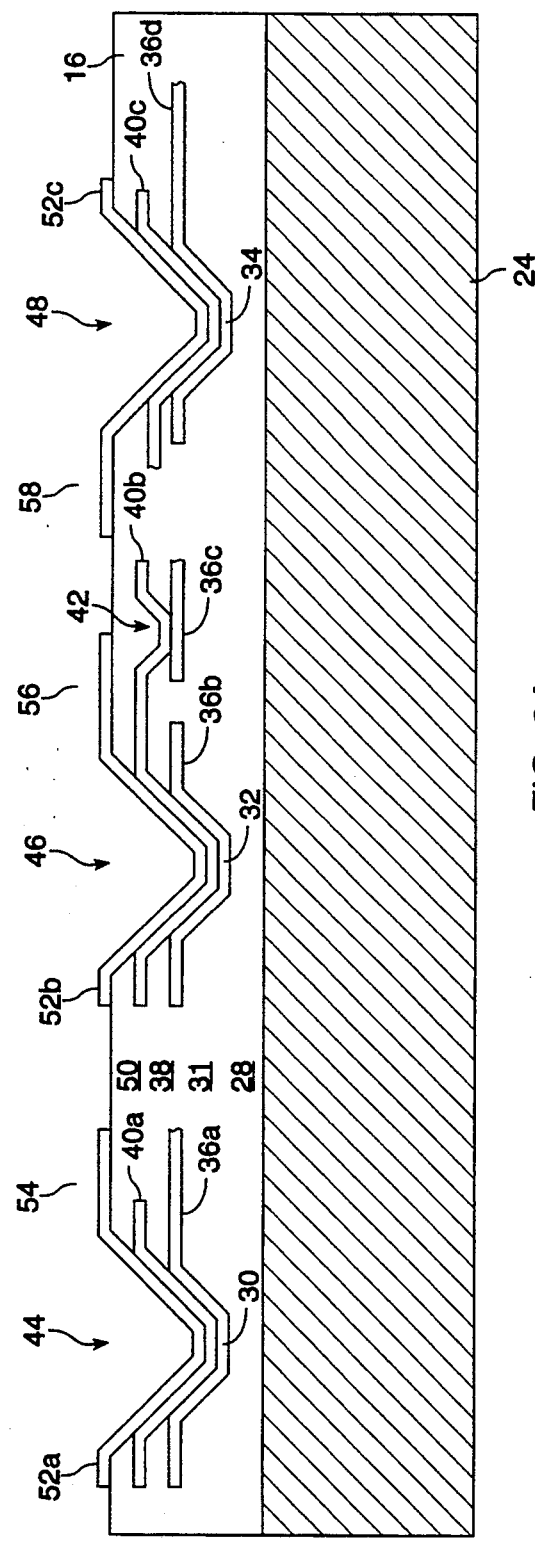
FIGS. 2a–2c are more detailed cross sectional views of a portion of the thin-film decal interconnect structure and aluminum frame substrate used in the multichip module assembly according to the present invention, showing details of the decal structure after selected processing steps used in the assembly.
Figure 2B:
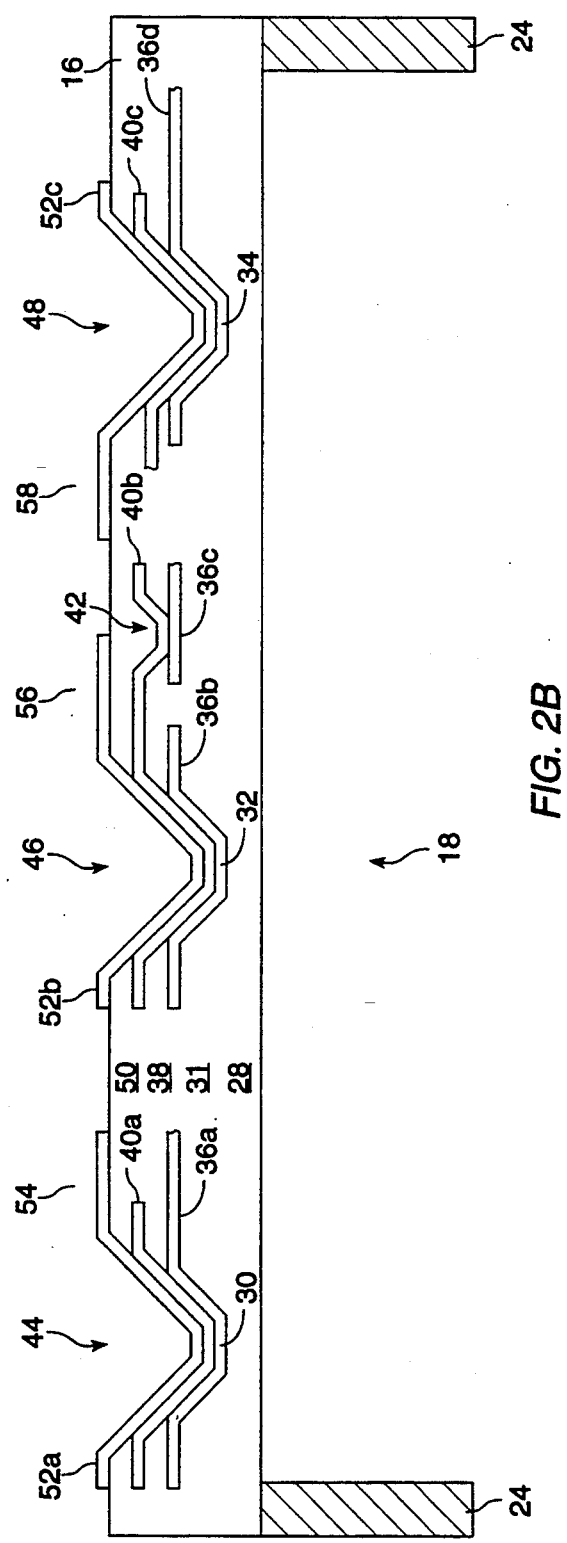
Figure 2C:
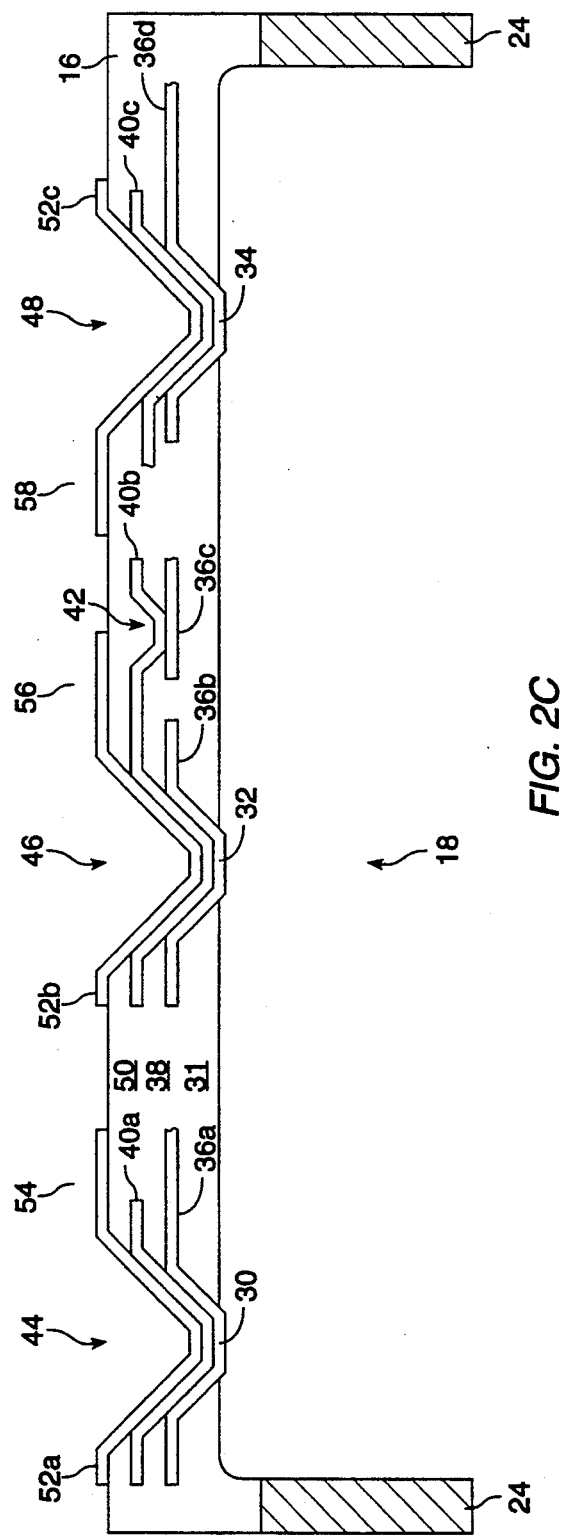

As previously mentioned, the thin-film decal interconnect structure 16 is initially disposed on the aluminum baseplate 22 which is used to form support frame 24. FIGS. 2a–2c are more detailed cross sectional views of the thin-film decal interconnect structure 16 and support frame 24. As may be seen from FIG. 2a, the thin-film decal interconnect structure 16 comprises several metal layers separated by insulating layers. More particularly, thin-film decal interconnect structure 16 is formed on an aluminum substrate which will become support frame 24 by the process described with reference to FIG. 1b. The embodiment disclosed herein is an illustrative embodiment employing polyimide material for the body of thin-film decal interconnect structure 16, but those of ordinary skill in the art will recognize that other materials will function in its place. In a typical embodiment of the present invention, thin-film decal interconnect structure 16 will have a thickness on the order of 1 to 2 mils.

The formation of the thin-film decal interconnect structure 16 is briefly described herein. Those of ordinary skill in the art will understand how to form such a structure. The formation of an illustrative embodiment of the thin-film decal interconnect structure 16 is disclosed in co-pending application Ser. No. 07/979,719, filed Nov. 20, 1992, now U.S. Pat. No. 5,402,077, entitled Bare Die Carrier, and assigned to the same assignee as the present invention. This application is expressly incorporated herein by reference. However, a brief description of the fabrication of thin-film decal interconnect structure 16 will aid those of ordinary skill in the art in understanding the present invention.

A first polyimide layer shown generally in the horizontal region of the entire structure defined at reference numeral 28 is first formed on the upper surface of aluminum substrate 22. First polyimide layer 28 will typically have a thickness of about between 1 and 2 microns. A first metal layer, forming contact pads 30, 32, and 34 is defined using conventional metal deposition and definition techniques. The first metal layer will typically have a thickness in the range of 2 to 10 microns and may comprise a metal such as gold or copper. A second polyimide layer 31 having a thickness of between about 12–24 microns is then deposited on the entire substrate surface. Contact vias for contact pads 30, 32, and 34 are then formed using conventional etching technology.

A second metal layer is deposited by conventional sputtering and plating steps to form metal interconnect conductors 36a, 36b, 36c, and 36d. Metal interconnect conductors 36a, 36b, and 36d are shown making contact to contact pads 30, 32, and 34. While metal interconnect conductor 36c is not shown making connections between circuit nodes disposed in the structure, those of ordinary skill in the art will appreciate that such connections are made by the various interconnect conductors. Contact pads 30, 32, and 34 will be used as bonding sites for the I/O connections of the die to be attached to the thin-film decal interconnect structure 16 by the backside-through-via thermosonic bonding technique of the present invention.

A third polyimide layer (shown generally in the horizontal region of the entire structure defined at reference numeral 38) is formed to cover the first metal interconnect layer and second layer of metal interconnect conductors 36a, 36b, 36c, and 36d. The third polyimide layer 38 acts as an inter-metal dielectric layer and may typically range in thickness from about 12 to 24 microns. Contact vias are formed in the third polyimide layer 38 for connections to be made between the second metal interconnect layer and a third optional layer of metal interconnect conductors 36a, 36b, 36c, and 36d, layer (which may be employed if needed) or a contact pad layer on the top surface of decal 16.

If employed, a third metal layer comprising an additional interconnect layer comprising metal interconnect conductors 40a, 40b, and 40c is formed using conventional metal deposition and definition techniques. Those of ordinary skill in the art will appreciate that an illustrative inter-metal via shown generally at reference numeral 42 is used to connect metal interconnect conductor 36c in the second metal layer to metal interconnect conductor 40b in the third metal layer. If employed, the third metal interconnect layer will typically have a thickness in the range of 4 microns and may comprise a metal such as copper.

According to a presently preferred embodiment of the invention, backside bonding vias 44, 46, and 48 are provided in order to accomplish the backside-through via bonding technique of the present invention. As presently preferred, apertures for bonding vias 44, 46, and 48 are present in the masking layers which define the interlayer vias in the structure such that segments of metal interconnect conductors 40a, 40b, and 40c of the third metal layer are deposited in bonding vias 44, 46, and 48 to strengthen contact pads 30, 32, and 34, although this may not be necessary for all embodiments of the present invention.

A fourth polyimide layer (shown generally in the horizontal region of the structure at reference numeral 50) is formed to cover the metal interconnect conductors of the third metal layer. Inter-metal vias are formed at selected locations to make contact, if required, to selected circuit nodes in the third metal interconnect layer, and to re-open bonding vias 44, 46, and 48 in a preferred embodiment of the invention. The fourth polyimide layer 50 may typically range in thickness from about 12 to 24 microns. Contact vias are formed in the fourth polyimide layer 50 for connections to be made between metal interconnect conductors 40a, 40b, and 40c in the third metal layer and a contact pad layer on the top surface of decal 16.

A fourth metal layer is deposited and defined over the surface of fourth polyimide layer 50 to form metal conductor segments 52a, 52b, and 52c. Metal conductor segments 52a, 52b, and 52c may be used as an additional interconnect layer if desired, and also provide contact pads 54, 56, and 58, which will be used to make electrical connections between the MCM device 10 and a printed circuit board to which it will be connected. The fourth metal layer may have a thickness of from about 10 to about 20 microns, and may comprise a metals such as copper, nickel, and gold, or solder. FIG. 2a shows the structure existing after all of these steps have been performed.

Those of ordinary skill in the art will recognize that the contact pads 54, 56, and 58 may be a portion of a large area array of contact pads. The use of an area array of contact pads permits the mounting of the MCM to a printed circuit board using solder ball, fuzz button, or other techniques, resulting in all of the interconnections between the MCM assembly and the circuit board to be under the MCM assembly. Because none of the area immediately surrounding the MCM is needed for MCM-to-board interconnect as when other interconnect schemes, such as lead frames are employed, a more densely packed circuit board assembly is possible using the present invention.

Referring now to FIG. 2b, after the steps necessary for the formation of the thin-film decal interconnect structure 16 shown in FIG. 2a have been performed, one or more cavities (illustrative cavity 18 is shown in FIG. 2b) are etched in baseplate 22 to expose the lower surface of thin-film decal interconnect structure 16 and to form support frame 24. As previously disclosed, cavity 18 may be preferably be formed using a two-step process in which the aluminum is first partially removed by milling and the remainder is then chemically etched. This etching step may be performed using an etching process which is reactive to aluminum but not reactive to the polymer material at the surface of the thin-film decal interconnect structure 16. A presently preferred etching process comprises hydrochloric acid.

Referring now to FIG. 2c, the structure of the decal is shown after the steps used to expose contact pads 30, 32, and 34 in cavity 18 in support frame 24. First polyimide layer 28 is etched back to expose a portion of the thicknesses of contact pads 30, 32, and 34 in preparation for bonding the integrated circuit die to the thin-film decal interconnect structure 16 in cavity 18. Typically, a thickness of about 3 to 5 microns may be removed to expose about 2 to 4 microns of the height of contact pads 30, 32, and 34.

Figure 2D:
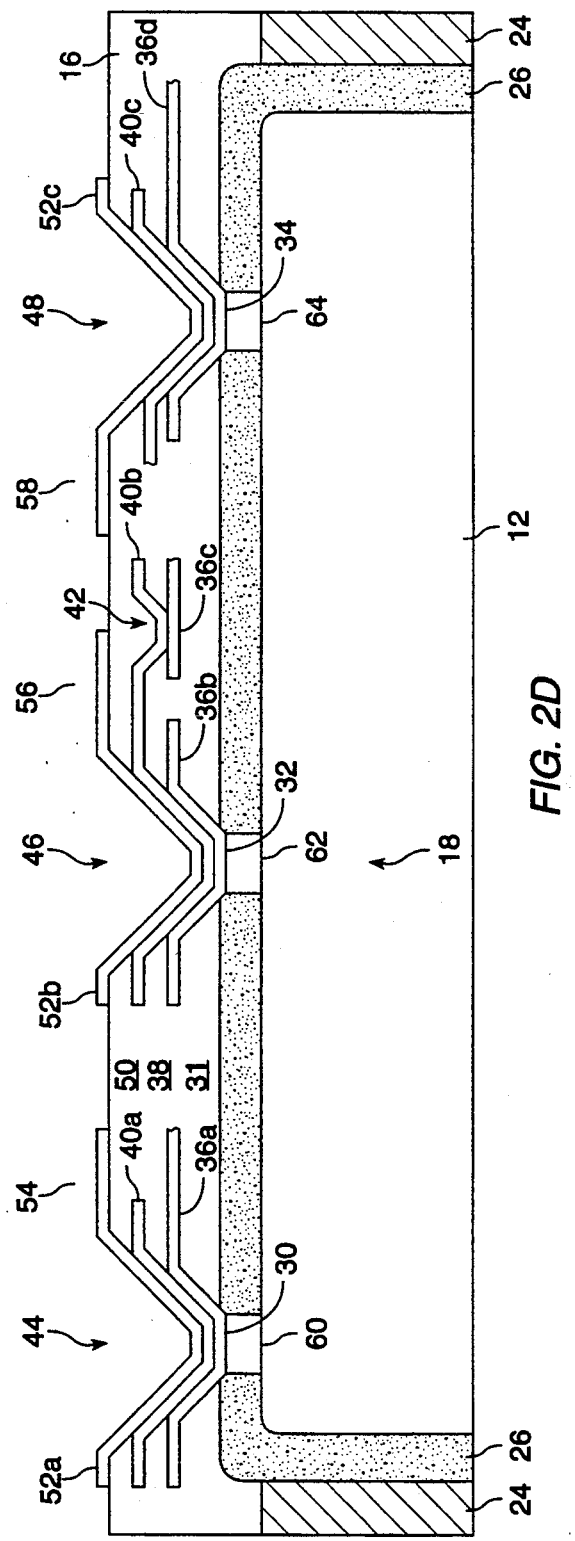
FIG. 2d is a cross-sectional view of a portion of the thin-film decal interconnect structure of FIG. 2c and a portion of an integrated circuit die backside- through-via bonded thereto, showing the decal to die bonding in more detail.

Referring now to FIG. 2d, an integrated circuit die 12 is shown mounted in cavity 18 with its I/O pads 60, 62, and 64, shown bonded to contact pads 30, 32, and 34, respectively. The bonding of integrated circuit die 12 to thin-film decal interconnect structure 16 may be accomplished according to an aspect of the present invention referred to as backside-through-via bonding. FIG. 2d also shows the liquid encapsulant 26, which has been introduced under vacuum and then cured as is known in the art. The structure of FIG. 2d is essentially complete and resembles the structure of FIG. 1e but in more detail.

The backside-through-via bonding process of the present invention uses conventional thermosonic wirebonding equipment. However, wire is not used. Instead, a special tool is used in the bonding head to effect the through-via bond. The design of the tool geometry has been optimized to provide the best bonding strength. The equipment setup parameters have also been optimized, but are well within the range used by conventional thermosonic wirebonding, and would be familiar to anyone of ordinary skill in the art.

According to a second embodiment of the present invention, one or more integrated circuit die may be mechanically bonded to the thin-film decal interconnect structure 16 with their metal pads disposed on the die surface opposite the surface bonded to the thin-film decal interconnect structure 16. The pads of the one or more integrated circuit die are connected to the bonding pads of the thin-film decal interconnect structure 16 by wire bonding technology. Such an embodiment is now described with reference to FIG. 3.

Figure 3:
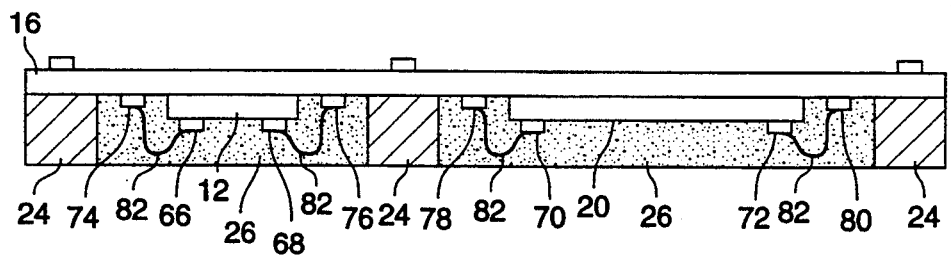
FIG. 3 is a cross sectional view of a portion of a multichip module assembly according to a second embodiment of the present invention.

Referring now to FIG. 3, a simplified cross sectional view of a portion of an illustrative multichip module assembly according to a second embodiment of the present invention is shown. As in the first embodiment of the present invention, thin-film decal interconnect structure 16 is disposed on support frame 24. In the embodiment of FIG. 3, the surfaces of integrated circuit dice 12 and 20 opposite to the surface containing their I/O pads have been mechanically bonded to the surface of thin-film decal interconnect structure 16 by means such as conductive epoxy, and the I/O pads (two illustrative I/O pads 66 and 68 on integrated circuit die 12 and two illustrative I/O pads 70 and 72 are shown on integrated circuit die 20) are connected to contact pads 74 and 76, and 78 and 80 of thin-film decal interconnect structure 16 with bond wires 82. As in the embodiment shown in FIGS. 1a-1e and 2a-2d, encapsulant 26 is used to seal the assembly, but the surface is not lapped to prevent damage to bond wires 82 from the lapping process.

Those of ordinary skill in the art will recognize that, like the previously disclosed embodiment, the embodiment of FIG. 3 also includes contact pads 54, 56, and 58, which may be a portion of a large area array of contact pads, on the surface of thin-film decal interconnect structure 16 opposite to the side on which integrated circuit dice 12 and 20 are mounted. The use of an area array of contact pads permits the mounting of the MCM assembly of this embodiment of the invention to a printed circuit board using solder ball or other techniques, resulting in all of the interconnections between the MCM assembly and the circuit board to be under the MCM assembly. Thus the embodiment of FIG. 3 also allows dense packing of a circuit board. However, due to the peripheral nature of the wire bond connecting the thin-film decal interconnect structure 12 and 20 to the integrated circuit dice 16, the embodiment of FIG. 3 does not permit the fabrication of an MCM assembly as dense as does the embodiment of FIGS. 1a–1e and 2a–2d.

Figure 4:
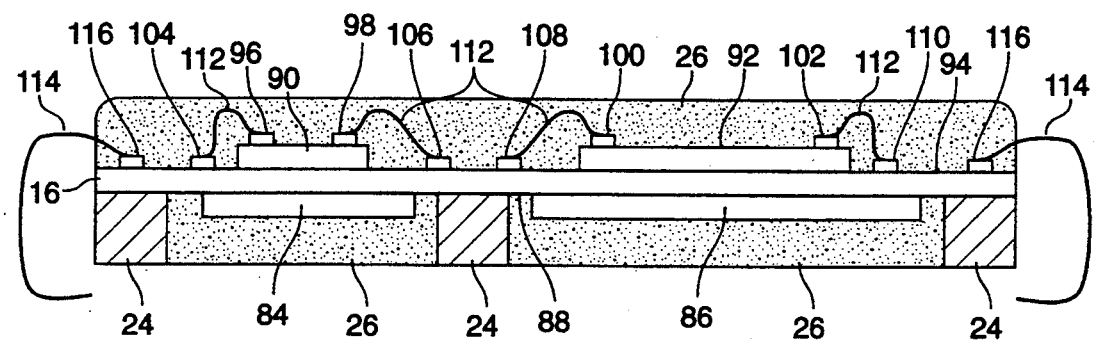
FIG. 4 is a cross sectional view of a portion of a multichip module assembly according to a third embodiment of the present invention.

A third embodiment of the present invention is illustrated in FIG. 4, a cross-sectional view of an MCM assembly. According to this embodiment of the invention, one or more first integrated circuit die 84 and 86 are placed in cavities in support frame 24 and are oriented with their pads in contact with contact pads on a first surface 88 of the thin-film decal interconnect structure 16 to which they are thermosonically bonded using the novel backside-through-via decal-to-die bonding process described herein and encapsulated with encapsulant 26.

After integrated circuit dice 84 and 86 have been bonded to the first surface 88 of thin-film decal interconnect structure 16, one or more second integrated circuit die 90 and 92 may be mechanically bonded to a second surface 94 of the thin-film decal interconnect structure 16 with their metal pads on the surface opposite the bonding surface. The I/O pads 96 and 98 of the second integrated circuit die 90 and the I/O pads 100 and 102 of the second integrated circuit die 92 are then connected to bonding pads 104 and 106, and 108 and 110, respectively, disposed on the second surface 94 of thin-film decal interconnect structure 16 around the periphery of integrated circuit dice 90 and 92 and bond wires 112. Because the second surface 94 of the thin-film decal interconnect structure 16 is populated with integrated circuit dice, the assembly of FIG. 4 must be connected to a printed circuit board via a peripheral mounting technology, such as a lead frame, shown at reference numeral 114. It therefore does not allow the same degree of I/O density as does the first embodiment of the invention.

Figure 5:
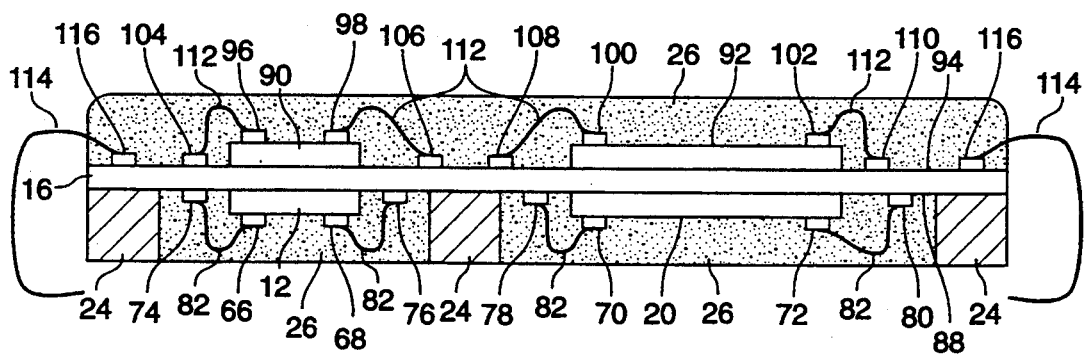
FIG. 5 is a cross sectional view of a portion of a multichip module assembly according to a fourth embodiment of the present invention.

A fourth embodiment of the invention is depicted in FIG. 5, a cross-sectional view of an MCM assembly according to the invention. As in the second embodiment of the present invention, thin-film decal interconnect structure 16 is disposed on support frame 24, and integrated circuit dice 12 and 20. In the embodiment of FIG. 3, the surfaces of integrated circuit dice 12 and 20 opposite to the surface containing their I/O pads are mechanically bonded to first surface 88 of thin-film decal interconnect structure 16 by means such as conductive epoxy. The I/O pads 66 and 68 of integrated circuit die 12 and 70 and 72 of integrated circuit die 20 are connected to contact pads 74 and 76, and 78 and 80 of thin-film decal interconnect structure 16 on first surface 88 of thin-film decal interconnect structure 16 with bond wires 82. As in the embodiment shown in FIG. 3, encapsulant 26 is used to seal the assembly, and the surface is not lapped to prevent damage to bond wires 82 from the lapping process.

As in the embodiment of FIG. 4, FIG. 5 shows that one or more second integrated circuit die 90 and 92 may be mechanically bonded to a second surface 94 of the thin-film decal interconnect structure 16 with their metal pads on the surface opposite the bonding surface. The I/O pads 96 and 98 of the second integrated circuit die 90 and the I/O pads 100 and 102 of the second integrated circuit die 92 are then connected to bonding pads 104 and 106, and 108 and 110, respectively, disposed on the second surface 94 of thin-film decal interconnect structure 16 around the periphery of integrated circuit dice 90 and 92 and bond wires 112.

Because two sides of the thin-film decal interconnect structure 16 are populated with dice, the MCM assembly of FIG. 5 allows a high degree of interconnect between the dice on both surfaces of the thin-film decal interconnect structure 16, limited only by the fact that all connections to the dice must be peripheral. However like the assemblies of FIG. 4, the assembly of FIG. 5 must be connected to a printed circuit board via a peripheral mounting technology, such as a lead frame, shown at reference numeral 114 bonded to contact pads 116, because the second surface 94 of the thin-film decal interconnect structure 16 is populated with integrated circuit dice. It therefore does not allow the same degree of I/O density as does the first embodiment of the invention, and does not permit the largest density of I/O.

In addition, because the dice on both surfaces of thin-film decal interconnect structure 16 are electrically connected thereto by wire bonding, those of ordinary skill in the art will recognize that surface lapping of the cured encapsulant 26 endangers the integrity of the wire bond connections. Therefore, it is not recommended and an MCM assembly according to this embodiment of the invention will be thicker than an of the other embodiments.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A multichip module packaging structure comprising:
   a thin film multilayer interconnect circuit disposed on a baseplate, said baseplate including at least one chip mounting cavity formed therein, said thin film multilayer interconnect circuit comprising a layer including a plurality of first bonding pads disposed on a first surface thereof, a layer including a plurality of second bonding pads disposed on a second surface thereof, and at least one routing layer including a plurality of routing conductors;
   at least one integrated circuit die disposed entirely within said at least one chip mounting cavity on said first surface of said thin film multilayer interconnect circuit, said at least one integrated circuit die having a first surface bonded to said first surface of said thin film multilayer interconnect circuit in a position such that said plurality of first bonding pads of said thin film multilayer interconnect circuit are disposed about the periphery of said at least one integrated circuit die, said at least one integrated circuit die including a plurality of I/O connection pads disposed on a second surface thereof opposed to said first surface thereof, ones of said plurality of I/O connection pads wire bonded to corresponding ones of said plurality of first bonding pads of said thin film multilayer interconnect circuit.

2. The multichip module packaging structure of claim 1 further including a layer of encapsulant disposed over said at least one integrated circuit die in said at least one chip mounting cavity.

3. A multichip module packaging structure comprising:

a thin film multilayer interconnect circuit disposed on a baseplate, said baseplate including at least one chip mounting cavity formed therein, said thin film multilayer interconnect circuit comprising a layer including a plurality of first bonding pads disposed on a first surface thereof, a layer including a plurality of second bonding pads disposed on a second surface thereof, and at least one routing layer including a plurality of routing conductors;

at least one first integrated circuit die having first and second surfaces and disposed entirely within said at least one chip mounting cavity on said first surface of said thin film multilayer interconnect circuit, said at least one first integrated circuit die including a plurality of first I/O connection pads disposed on said first surface thereof in contact with said first surface of said thin film multilayer interconnect circuit, said at least one first integrated circuit die aligned so as to mate said plurality of I/O connection pads with said plurality of first bonding pads, said first I/O connection pads thermosonically bonded to said first bonding pads; and at least one second integrated circuit die disposed on said second surface of said thin film multilayer interconnect circuit, said at least one second integrated circuit die having a first surface bonded to said second surface of said thin film multilayer interconnect circuit in a position such that said plurality of second bonding pads of said thin film multilayer interconnect circuit are disposed about the periphery of said at least one second integrated circuit die, said at least one second integrated circuit die including a plurality of second I/O connection pads disposed on a second surface thereof opposed to said first surface thereof, ones of said plurality of second I/O connection pads wire bonded to corresponding ones of said plurality of second bonding pads of said thin film multilayer interconnect circuit.

4. The multichip module packaging structure of claim 3 further including a layer of encapsulant disposed over said at least one first and second integrated circuit die.

5. A multichip module packaging structure comprising:

a thin film multilayer interconnect circuit disposed on a baseplate, said baseplate including at least one chip mounting cavity formed therein, said thin film multilayer interconnect circuit comprising a layer including a plurality of first bonding pads disposed on a first surface thereof, a layer including a plurality of second bonding pads disposed on a second surface thereof, and at least one routing layer including a plurality of routing conductors;

at least one first integrated circuit die disposed entirely in said at least one chip mounting cavity on said first surface of said thin film multilayer interconnect circuit, said at least one first integrated circuit die having a first surface bonded to said first surface of said thin film multilayer interconnect circuit in a position such that said plurality of first bonding pads of said thin film multilayer interconnect circuit are disposed about the periphery of said at least one first integrated circuit die, said at least one first integrated circuit die including a plurality of first I/O connection pads disposed on a second surface thereof opposed to said first surface thereof, ones of said plurality of first I/O connection pads wire bonded to corresponding ones of said plurality of first bonding pads of said thin film multilayer interconnect circuit; and at least one second integrated circuit die disposed on said second surface of said thin film multilayer interconnect circuit, said at least one second integrated circuit die having a first surface bonded to said second surface of said thin film multilayer interconnect circuit in a position such that said plurality of second bonding pads of said thin film multilayer interconnect circuit are disposed about the periphery of said at least one second integrated circuit die, said at least one second integrated circuit die including a plurality of second I/O connection pads disposed on a second surface thereof opposed to said first surface thereof, ones of said plurality of second I/O connection pads wire bonded to corresponding ones of said plurality of second bonding pads of said thin film multilayer interconnect circuit.

6. The multichip module packaging structure of claim 5 further including a layer of encapsulant disposed over said at least one first and second integrated circuit die.

7. A multichip module packaging structure comprising:

a thin film multilayer interconnect circuit disposed on a baseplate, said baseplate including a plurality of chip mounting cavities formed therein, said thin film multilayer interconnect circuit comprising a layer including a plurality of first bonding pads disposed on a first surface thereof, a layer including a plurality of second bonding pads disposed on a second surface thereof, and at least one routing layer including a plurality of routing conductors;

a plurality of integrated circuit dice, one of said integrated circuit dice disposed within each of said plurality of chip mounting cavities, each of said integrated circuit dice having a first surface bonded to said first surface of said thin film multilayer interconnect circuit in a position such that said plurality of first bonding pads of said thin film multilayer interconnect circuit are disposed about the periphery of each of said integrated circuit dice, each of said integrated circuit dice including a plurality of I/O connection pads disposed on a second surface thereof opposed to said first surface thereof, ones of said plurality of I/O connection pads wire bonded to corresponding ones of said plurality of first bonding pads of said thin film multilayer interconnect circuit.

8. The multichip module packaging structure of claim 7 further including a layer of encapsulant disposed over said plurality of integrated circuit dice in said at least one chip mounting cavity.

9. A multichip module packaging structure comprising:

a thin film multilayer interconnect circuit disposed on a baseplate, said baseplate including a plurality of chip mounting cavity formed therein, said thin film multilayer interconnect circuit comprising a layer including a plurality of first bonding pads disposed on a first surface thereof, a layer including a plurality of second bonding pads disposed on a second surface thereof, and at least one routing layer including a plurality of routing conductors;

a plurality of integrated circuit dice having first and second surfaces, one of said integrated circuit dice disposed within each of said chip mounting cavities on said first surface of said thin film multilayer interconnect circuit, each of said first integrated circuit dice including a plurality of first I/O connection pads disposed on said first surface thereof in contact with said first surface of said thin film multilayer interconnect circuit, each of said integrated circuit dice aligned so that its plurality of I/O connection pads align with ones of first bonding pads, said first I/O connection pads thermosonically bonded to said first bonding pads; and at least one second integrated circuit die disposed on said second surface of said thin film multilayer interconnect circuit, said at least one second integrated circuit die having a first surface bonded to said second surface of said thin film multilayer interconnect circuit in a position such that said plurality of second bonding pads of said thin film multilayer interconnect circuit are disposed about the periphery of said at least one second integrated circuit die, said at least one second integrated circuit die including a plurality of second I/O connection pads disposed on a second surface thereof opposed to said first surface thereof, ones of said plurality of second I/O connection pads wire bonded to corresponding ones of said plurality of second bonding pads of said thin film multilayer interconnect circuit.

10. The multichip module packaging structure of claim 9 further including a layer of encapsulant disposed over said first and second integrated circuit dice.

11. The multichip module packaging structure of claim 9 wherein said at least one second integrated circuit die comprises a plurality of integrated circuit dice.

12. A multichip module packaging structure comprising:

a thin film multilayer interconnect circuit disposed on a baseplate, said baseplate including a plurality of chip mounting cavities formed therein, said thin film multilayer interconnect circuit comprising a layer including a plurality of first bonding pads disposed on a first surface thereof, a layer including a plurality of second bonding pads disposed on a second surface thereof, and at least one routing layer including a plurality of routing conductors;

a plurality of first integrated circuit dice, one of said first integrated circuit dice disposed in each of said chip mounting cavities on said first surface of said thin film multilayer interconnect circuit, each of said first integrated circuit dice having a first surface bonded to said first surface of said thin film multilayer interconnect circuit in a position such that ones of said plurality of first bonding pads of said thin film multilayer interconnect circuit are disposed about the periphery of each of said at first integrated circuit dice, each of said first integrated circuit dice including a plurality of first I/O connection pads disposed on a second surface thereof opposed to said first surface thereof, ones of said plurality of first I/O connection pads wire bonded to corresponding ones of said plurality of first bonding pads of said thin film multilayer interconnect circuit; and at least one second integrated circuit die disposed on said second surface of said thin film multilayer interconnect circuit, said at least one second integrated circuit die having a first surface bonded to said second surface of said thin film multilayer interconnect circuit in a position such that said plurality of second bonding pads of said thin film multilayer interconnect circuit are disposed about the periphery of said at least one second integrated circuit die, said at least one second integrated circuit die including a plurality of second I/O connection pads disposed on a second surface thereof opposed to said first surface thereof, ones of said plurality of second I/O connection pads wire bonded to corresponding ones of said plurality of second bonding pads of said thin film multilayer interconnect circuit.

13. The multichip module packaging structure of claim 12 further including a layer of encapsulant disposed over said first and second integrated circuit dice.

* * * * *